United States Patent
Sul

(10) Patent No.: US 7,196,596 B2
(45) Date of Patent: Mar. 27, 2007

(54) FILM BULK-ACOUSTIC RESONATOR FILTER HAVING UNBALANCED-BALANCED INPUT/OUTPUT STRUCTURE

(75) Inventor: Sang Chul Sul, Suwon (KR)

(73) Assignee: Samsung Electro-Mechanics Co., Ltd., Kyungki-Do (KR)

(*) Notice: Subject to any disclaimer, the term of this patent is extended or adjusted under 35 U.S.C. 154(b) by 64 days.

(21) Appl. No.: 11/059,375

(22) Filed: Feb. 17, 2005

(65) Prior Publication Data

US 2006/0061435 A1    Mar. 23, 2006

(30) Foreign Application Priority Data

Sep. 23, 2004   (KR) .......................... 10-2004-76303

(51) Int. Cl.
*H03H 9/00*   (2006.01)
*H03H 9/10*   (2006.01)

(52) U.S. Cl. ...................... 333/187; 333/190

(58) Field of Classification Search ................ 333/133, 333/186, 187, 189, 190, 191
See application file for complete search history.

(56) References Cited

U.S. PATENT DOCUMENTS 6,670,866 B2   12/2003   Ellä et al. .................... 333/133

FOREIGN PATENT DOCUMENTS

JP   2003-338723   11/2003
KR   2003-25247    3/2003

OTHER PUBLICATIONS

Korean Intellectual Property Office Office Action mailed May 22, 2006.

*Primary Examiner*—Dean Takaoka
(74) *Attorney, Agent, or Firm*—Lowe Hauptman & Berner

(57) ABSTRACT

An FBAR filter includes a wafer, a filter circuit unit and a balun circuit unit. The filter circuit unit includes a plurality of FBAR resonators formed on a predetermined region on a top of the wafer. The balun circuit unit includes a plurality of metal layers electrically connected to each other to implement a balun circuit and a plurality of dielectric layers each placed between the plurality of metal layers. The balun circuit unit is electrically connected to the filter circuit unit on a predetermined region of the wafer.

9 Claims, 5 Drawing Sheets

FILM BULK-ACOUSTIC RESONATOR FILTER HAVING UNBALANCED-BALANCED INPUT/OUTPUT STRUCTURE

RELATED APPLICATION

The present invention is based on, and claims priority from, Korean Application Number 2004-76303, filed Sep. 23, 2004, the disclosure of which is incorporated by reference herein in its entirety.

BACKGROUND OF THE INVENTION

1. Field of the Invention

The present invention relates, in general, to film bulk acoustic resonator filters having an unbalanced-balanced input/output structure and, more particularly, to a film bulk acoustic resonator filter having an unbalanced-balanced input/output structure, which improves the implementation of the mass production of the filter while enabling a balun circuit unit for converting between an unbalanced signal and a balanced signal and a filter circuit unit for filtering an input signal to be implemented on a single chip using simpler processing.

2. Description of the Related Art

Currently, in the case of an RX filter provided in a Radio Frequency (RF) transceiver, such as a Code Division Multiple Access (CDMA) system or a Global System for Mobile communications (GSM), an antenna end connected to an input terminal of the RX filter has an unbalanced structure, and a receiving end connected to an output terminal of the RX filter requires a balanced signal. Therefore, the RX filter requires an unbalanced-balanced input/output structure.

For an RX filter suitable for this requirement, a SAW filter comprised of an acoustically coupled Surface Acoustic Wave (SAW) filter has been broadly used, and is advantageous in that it can be easily implemented using a balanced input/output, unbalanced input/output or balanced-unbalanced input/output structure.

However, as the use of wireless communication has recently increased, a Film Bulk Acoustic Resonator (FBAR) filter, which can be easily implemented with a Monolithic Microwave Integrated Circuit (MMIC), be operated at an ultrahigh frequency of 15 GHz, and realize super light weight and microminiaturization, has been researched as an advanced device.

An FBAR resonates at a certain frequency band by evaporating Zinc Oxide (ZnO) or Aluminum Nitride (AlN), which is a piezoelectric material, on a silicon (Si) or Gallium Arsenide (GaAs) wafer using an RE magnetron sputtering method and causing a piezoelectric phenomenon. Further, if an input is applied to an upper or lower electrode, a Bulk Acoustic Wave (BAW) is generated due to a piezoelectric effect. Further, if the frequency of the BAW becomes equal to that of an input electrical signal, resonance occurs. Further, resonators using this resonance are electrically coupled to each other, so that an FBAR filter and even an FBAR duplexer can be implemented.

RF devices using the FBAR have several advantages, in that filters using various frequency bands, such as a local area communication filter (2 GHz) for Bluetooth and a filter for Global Positioning System (GPS) communication, can be manufactured in addition to a filter for International Mobile Telecommunication (IMT)-2000 band, a maximum operational frequency band can be extended up to 15 GHz, and a conventional semiconductor wafer is used and the RF devices can be integrated with other active devices, so that a frequency control circuit can be completely implemented with an MMIC. However, an FBAR filter is generally manufactured in the form of a ladder-type filter having an unbalanced input-unbalanced output structure or a lattice-type filter having a balanced input-balanced output structure. The FBAR filter is advantageous in that it is difficult to implement an FBAR filter having an unbalanced-balanced input/output structure.

Therefore, in order to use such an FBAR filter as an RX filter placed between an antenna end and a receiving end, a Balun transformer for converting between an unbalanced signal and a balanced signal is required. Further, in order to realize miniaturization, various research into integrating the Balun transformer and the FBAR filter into a single chip have been conducted.

As an example of the research, Lakin shows that, when the input and output of a Coupled Resonator Filter (CRF) that is comprised of two FBAR resonators layered in a longitudinal direction and a coupling layer interposed between the resonators to control the acoustic coupling thereof are electrically separated, the CRF can be used as a balun. U.S. Pat. No. 6,670,866 proposes an FBAR balun using the above method.

FIG. 1 is a sectional view showing the structure of an FBAR balun proposed in U.S. Pat. No. 6,670,866. As shown in FIG. 1, the conventional FBAR balun includes a first electrode 12a connected to a balanced signal output end 11c, a first piezoelectric layer 13a formed on the first electrode 12a, a second electrode 12b that is formed on the first piezoelectric layer 13a and grounded, a dielectric layer 14 formed on the second electrode 12b, a third electrode 12c that is formed on the dielectric layer 14 and connected to a balanced signal output end 11b, a second piezoelectric layer 13b formed on the third electrode 12c, and a fourth electrode 12d that is formed on the second piezoelectric layer 13b and connected to an unbalanced signal input end 11a.

As described above, the conventional FBAR balun is constructed in a structure in which a first resonator 16 comprised of the first electrode 12a, the first piezoelectric layer 13a and the second electrode 12b, and a second resonator 17 comprised of the third electrode 12c, the second piezoelectric layer 13b and the fourth electrode 12d are sequentially stacked, with the dielectric layer 14 placed therebetween. In addition, in order to improve unbalanced parasitic characteristics, a compensation capacitor 15a is connected between the second electrode 12b and the fourth electrode 12d. Further, in order to increase the bandwidth between the two resonators 16 and 17, a coupling inductor 15b is connected between the first and second electrodes 12a and 12b, and a coupling inductor 15c is connected between the third and fourth electrodes 12c and 12d.

Further, as shown in FIGS. 2a and 2b, the FBAR balun 10 is coupled to a ladder-type FBAR filter 24 or a lattice-type FBAR filter 25, so that the FBAR balun 10 and the filter 24 or 25 can be implemented on a single chip. Therefore, when a filter having an unbalanced-balanced input/output structure is implemented, the size of the filter can be greatly decreased while the manufacturing process thereof can be simplified.

However, the above FBAR balun has a fatal disadvantage in that, since it is difficult to obtain a target yield, the implementation of the mass production of the FBAR balun greatly decreases. In detail, a typical FBAR resonator is a layered structure including an electrode layer, a piezoelectric layer and an electrode layer, and the operational frequency thereof is determined by the thickness of each layer. Therefore, in order to obtain the target yield of the FBAR resonator, in-wafer uniformity and wafer-to-wafer uniformity of the thicknesses of respective layers must be guaranteed. However, since the technical precision of current equipment for forming layers is not sufficient to guarantee uniformity of the thicknesses of respective layers, it is impossible to guarantee a yield meeting a target level. In order to improve upon this disadvantage, the yield of frequency is improved through a frequency adjustment process after devices are manufactured, at the time of manufacturing an FBAR resonator. However, since the above-described multi-layered FBAR balun has a very complicated structure comprised of two piezoelectric layers, four electrode layers and one dielectric layer, it is almost impossible to guarantee uniformity of the thicknesses of respective layers to a desired target level even though the frequency adjustment process is added. Therefore, it is actually impossible to achieve a target yield sufficient to guarantee the implementation of the mass production or the marketability of the above-described two-layered FBAR balun.

Moreover, the above-described FBAR balun has problems, such as the control of internal stress caused by a multi-layered structure, the guarantee of the orientation of the second piezoelectric layer 13b, and the decrease of the amount of production caused by the slow speed of formation of the first and second piezoelectric layers.

SUMMARY OF THE INVENTION

Accordingly, the present invention has been made keeping in mind the above problems occurring in the prior art, and an object of the present invention is to provide an FBAR filter having an unbalanced-balanced input/output structure, which improves the implementation of the mass production of the FBAR filter while allowing a filter circuit for filtering an input signal and a balun circuit for converting an unbalanced signal into a balanced signal to be implemented on a single chip.

In order to accomplish the above object, the present invention provides a Film Bulk Acoustic Resonator (FBAR) filter having an unbalanced-balanced input/output structure, the FBAR filter receiving an unbalanced input signal, filtering the unbalanced input signal in a predetermined frequency band and outputting a filtered signal as a balanced output signal, comprising a wafer; a filter circuit unit including a plurality of FBAR resonators formed on a predetermined region on a top of the wafer; and a balun circuit unit including a plurality of metal layers electrically connected to each other to implement a balun circuit and a plurality of dielectric layers each placed between the plurality of metal layers, the balun circuit unit being electrically connected to the filter circuit unit on a predetermined region of the wafer.

Preferably, the filter circuit unit may be implemented with a ladder-type filter circuit unit or a lattice-type filter circuit unit.

Preferably, the balun circuit unit may be a transmission line-type balun circuit including two or more striplines, or a lumped element-type balun circuit implemented with a combination of passive devices, such as a resistor (R), an inductor (L) and a capacitor (C).

Preferably, the filter circuit unit may be hermetically sealed by a cap structure including sidewalls with a certain height and an upper cover coupled to top of the sidewalls.

Preferably, the balun circuit unit may include a first metal layer formed on the wafer, a first dielectric layer formed on the first metal layer at a height identical to that of the sidewalls of the filter circuit unit, a second metal layer formed on the first dielectric layer, a second dielectric layer formed on the second metal layer at a height identical to that of the upper cover of the filter circuit unit, and a third metal layer formed on the second dielectric layer.

Preferably, the sidewalls and the upper cover of the filter circuit unit and the dielectric layers of the balun circuit unit may be made of the same material, for example, a polymer or a dry film.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Hereinafter, embodiments of the present invention will be described in detail with reference to the attached drawings. In the following description of the present invention, detailed descriptions may be omitted if it is determined that the detailed descriptions of related well-known functions and construction may make the gist of the present invention unclear.

Figure 1:
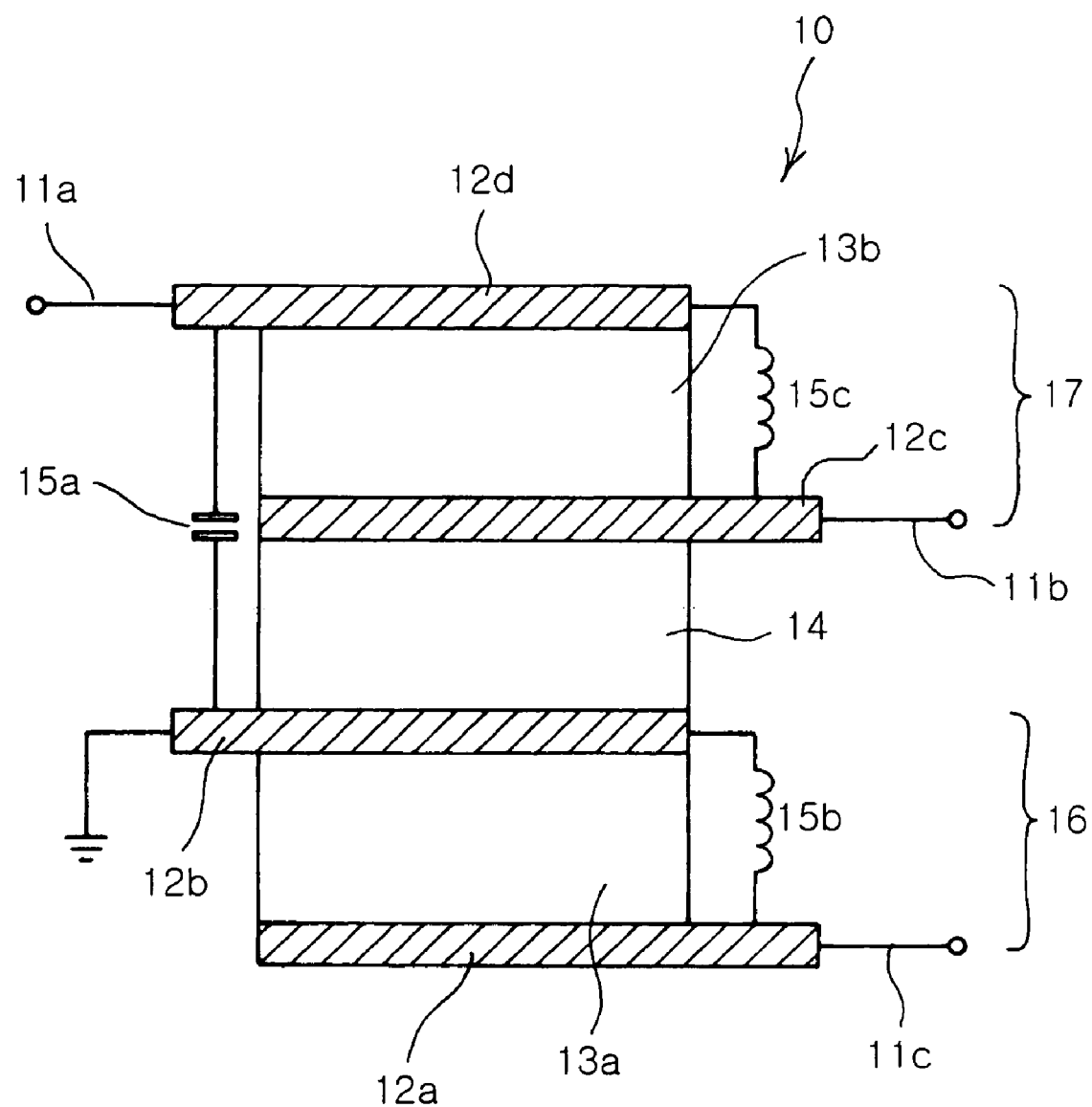
FIG. 1 is a view showing the construction of a conventional FBAR balun transformer.
Figure 2A:
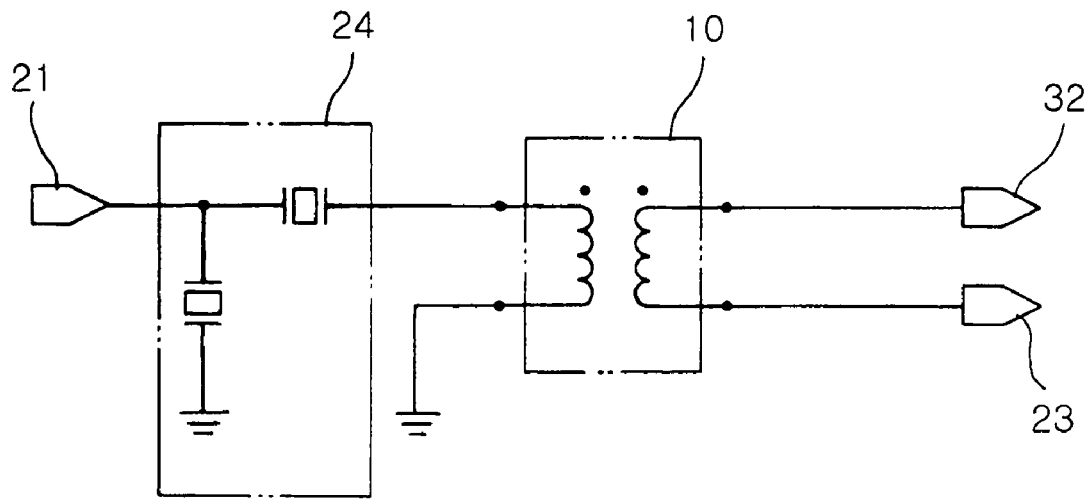
FIGS. 2a and 2b are views showing the construction of an FBAR filter having an unbalanced-balanced input/output structure implemented with the FBAR balun transformer of FIG. 1.
Figure 2B:
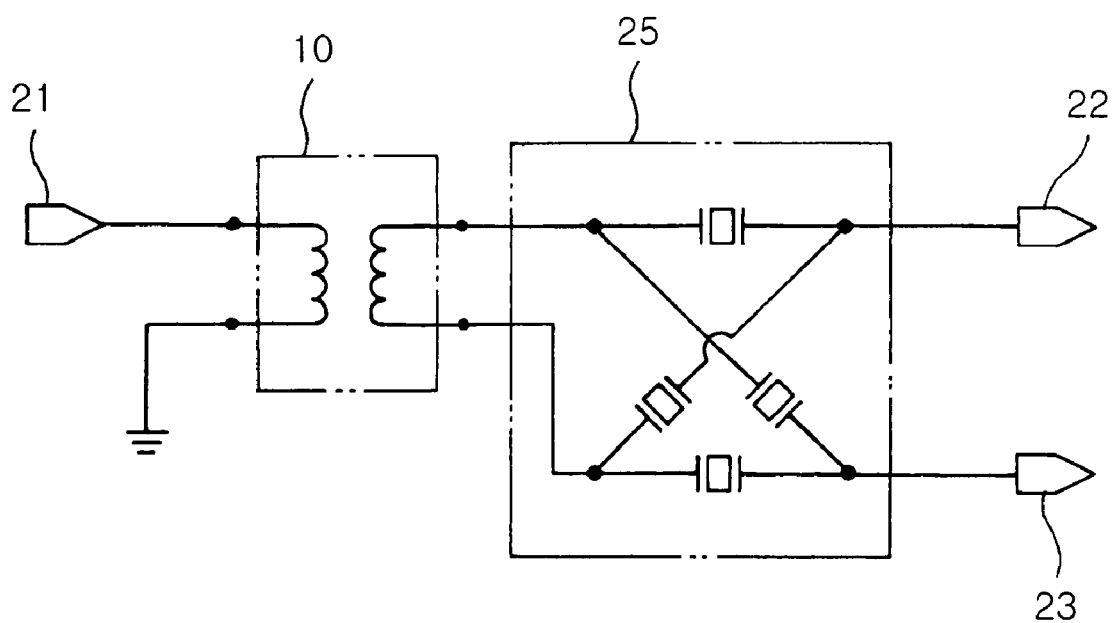
Figure 3:
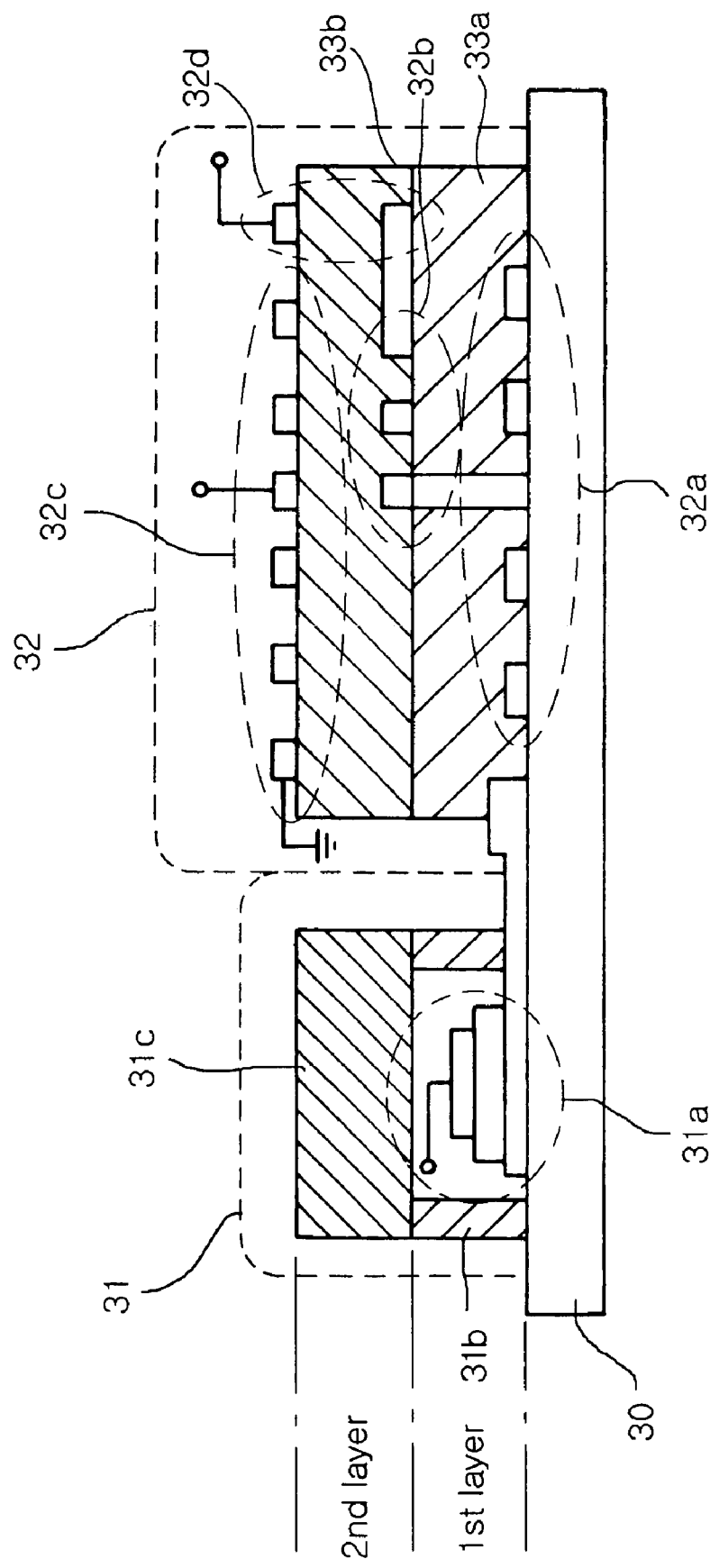
FIG. 3 is a sectional view showing the construction of an FBAR filter having an unbalanced-balanced input/output structure according to the present invention.

FIG. 3 is a sectional view showing the construction of an FBAR filter having an unbalanced-balanced input/output structure according to the present invention.

Referring to FIG. 3, the FBAR filter having an unbalanced-balanced input/output structure of the present invention is characterized in that a filter circuit unit 31 and a balun circuit unit 32 are formed together on a wafer 30 made of silicon (Si), etc.

The filter circuit unit 31 is implemented with a combination of a plurality of FBAR resonators 31a. Each of the FBAR resonators 31a is constructed in a layered structure in which a lower electrode layer, a piezoelectric layer and an upper electrode layer are sequentially layered. The filter circuit unit 31 is implemented in such a way that the resonators 31a are formed using one or more series resonators, connected in series with a signal line, and one or more shunt resonators, disposed between the signal line and a ground line, and are connected to each other through circuit coupling. In this case, the circuit coupling is formed in a ladder-type or lattice-type structure. The embodiment of the detailed circuit is well known in the art.

In addition, although not shown in detail in FIG. 3, a structure for preventing a sound wave generated by the FBAR resonators 31a from propagating to other regions of the wafer 30, such as an air gap or Bragg reflecting layer, is included in a lower portion of each of the FBAR resonators 31a.

Further, the filter circuit unit 31 is hermetically sealed in a cap structure using a dielectric material, such as a dry film or other polymers. In detail, the cap structure includes sidewalls 31b placed around each of the FBAR resonators 31a at a predetermined height, and an upper cover 31c placed over each of the FBAR resonators 31a while being spaced apart from the top of the FBAR resonator by a certain height, and coupled to the sidewalls 31b to seal the inside of the cap structure. In this case, a material forming the sidewalls 31b and the upper cover 31c is not limited to a dry film, but any material that can be used as the dielectric layer of the balun 32, such as various polymers, can be used as the material.

Next, the balun circuit unit 32 includes integrated passive devices 32a to 32d formed on a plurality of metal layers, and a plurality of dielectric layers 33a and 33b each placed between the metal layers.

Especially, the balun circuit unit 32 is implemented with an Integrated Passive Device (IPD) balun, which can be realized as a Monolithic Microwave Integrated Circuit (MMIC), so as to allow the balun circuit unit 32 to be formed together with the cap structure of the filter circuit unit 31 through a single manufacturing process. The balun circuit unit 32 includes three metal layers on which passive devices, for example, $\lambda/4$ striplines, resistor R, an inductor L, a capacitor C, etc. are separately formed, and first and second dielectric layers 33a and 33b each placed between the metal layers.

Preferably, the IPD balun, forming the balun circuit unit 32, may be a transmission line-type balun (Marchand balun) formed using a $\lambda/4$ transmission line, or a lumped element-type balun formed using a plurality of inductors and capacitors. These IPD baluns are advantageous in that excellent insertion loss can be obtained and slimness can be realized compared to a Low Temperature Cofired Ceramic (LTCC) balun that is implemented on a multi-layered ceramic wafer. Generally, an IPD balun is formed in a structure in which an R/L/C circuit is constructed on a silicon wafer with high resistance in a multi-layered structure and integrated thereon. In this case, NiCr is used as the material of the resistor R, SiN is used as the dielectric material of the capacitor C, and Au or Cu having a thickness of 1 to 20 μm, formed using an evaporation method or formed of a plating layer, is used as the electrode material of the inductor L. That is, in the FBAR filter having an unbalanced-balanced input/output structure of the present invention, the balun circuit unit 32 is implemented in such a way that the R/L/C circuit is formed in a three-layered structure on the top and bottom surfaces of the first and second dielectric layers 33a and 33b that are formed simultaneously with the sidewalls 31b and the upper cover 31c of the filter circuit unit 31.

For example, the balun circuit unit 32 of FIG. 3 is implemented with a transmission line-type balun circuit, in which a $\lambda/4$ stripline 32a is formed on the first metal layer formed on the top surface of the wafer 30, an inductor 32b and a part of a capacitor 32d are formed on the second metal layer placed between the first and second dielectric layers 33a and 33b, and a $\lambda/4$ stripline 32c and the remaining part of the capacitor 32d are formed on the third metal layer formed on the top surface of the second dielectric layer 33b. In this case, the $\lambda/4$ striplines 32a and 32c are preferably formed in a spiral or meander line shape so as to reduce the size of devices. The structure of the balun circuit unit 32 can be modified into various shapes according to the design thereof.

Both the filter circuit unit 31 and the balun circuit unit 32 can be variously electrically connected to each other according to the circuit type of the filter circuit unit 31.

FIGS. 4a to 4d are circuit diagrams showing examples of the FBAR filter of the present invention having the construction of FIG. 3.

Figure 4A:
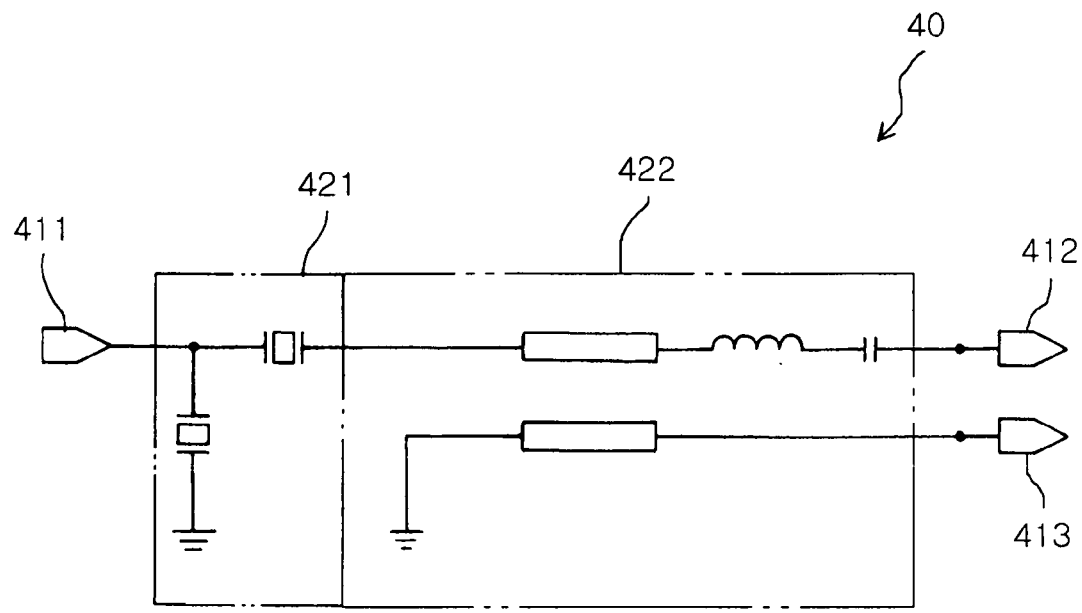
FIGS. 4a to 4d are circuit diagrams showing examples of the construction of the FBAR filter of FIG. 3.

Referring to FIG. 4a, the FBAR filter having an unbalanced-balanced input/output structure of the present invention may include a ladder-type filter circuit unit 421 connected to an unbalanced input end 411 to filter an input signal, and a transmission line-type balun circuit unit 422 having an unbalanced terminal connected to an output terminal of the ladder-type filter circuit unit 421 and balanced terminals connected to balanced signal output, ends 412 and 413.

Figure 4B:
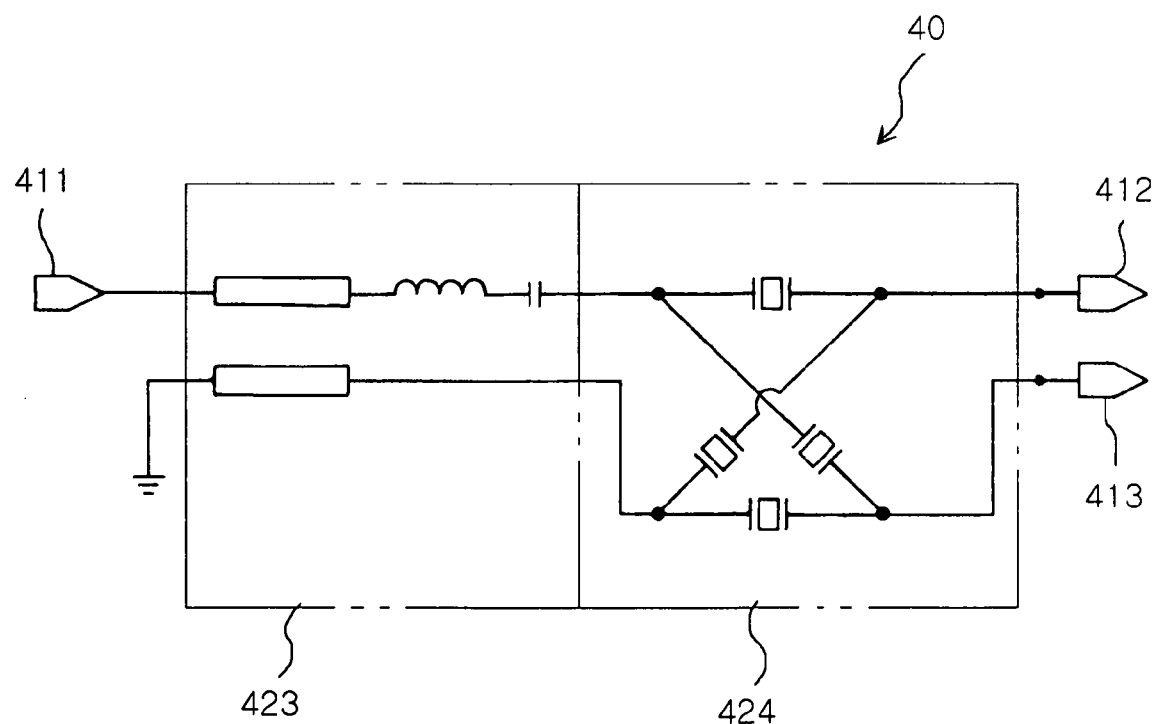

Referring to FIG. 4b, the FBAR filter having an unbalanced-balanced input/output structure of the present invention may be implemented with the coupling of a transmission line-type balun circuit unit 423, connected to an unbalanced input end 411 to convert an input unbalanced signal into a balanced signal, to a lattice-type filter circuit unit 424 having input terminals connected to balanced terminals of the balun circuit unit 423 and output terminals connected to balanced output ends 412 and 413.

Figure 4C:
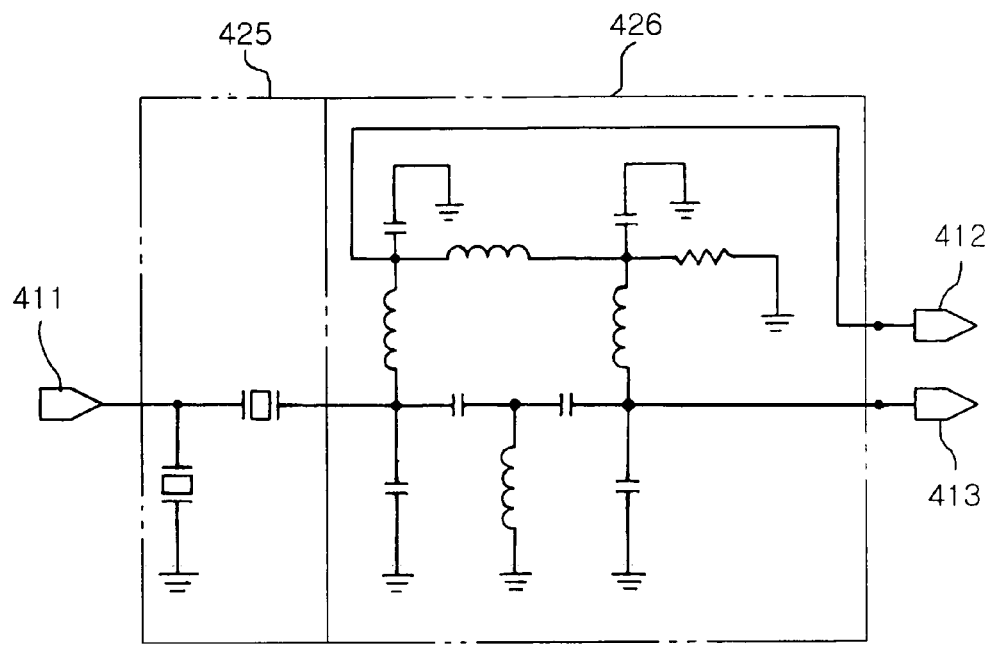

Further, referring to FIG. 4c, the FBAR filter having an unbalanced-balanced input/output structure of the present invention may be implemented with the coupling of a ladder-type filter circuit unit 425, connected to an unbalanced input end 411 to filter an input signal, to a lumped element-type balun circuit unit 426 having an unbalanced terminal connected to an output terminal of the ladder-type filter circuit unit 425 and balanced terminals connected to balanced signal output ends 412 and 413.

Figure 4D:
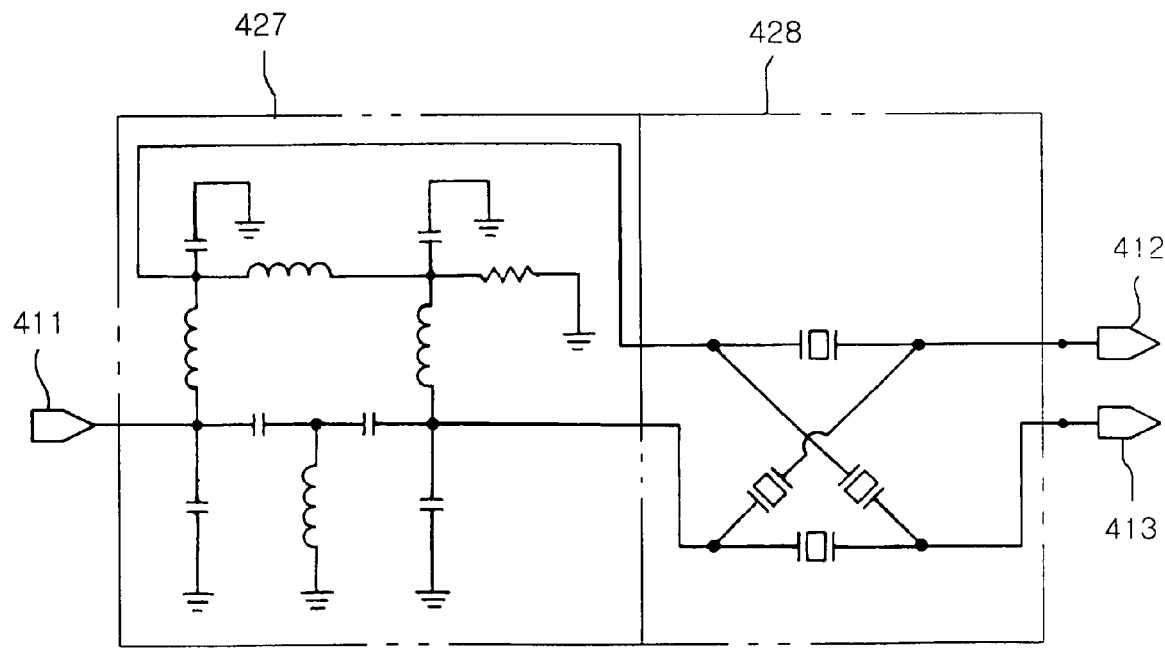

Further, referring to FIG. 4d, the FBAR filter having an unbalanced-balanced input/output structure of the present invention may be implemented with the coupling of a lumped element-type balun circuit unit 427, connected to an unbalanced input end 411 to convert an input unbalanced signal into a balanced signal, to a lattice-type filter circuit unit 428 having input terminals connected to balanced terminals of the balun circuit unit 427 and output terminals connected to balanced output ends 412 and 413.

In the case of the implementation of the circuits in FIGS. 4a and 4c, the input terminal of the filter circuit unit 421 or 425 and the balanced terminals of the balun circuit unit 422 or 426 are electrically connected to external electrodes (or bonding pads) on the bottom of the wafer 30 through via holes. The output terminal of the filter circuit unit 421 or 425 is electrically connected to the unbalanced terminal of the balun circuit unit 422 or 426 on the wafer.

On the contrary, in the case of the implementation of the circuits in FIGS. 4b and 4d, the output terminals of the filter circuit unit 424 or 428 and the unbalanced terminal of the balun circuit unit 423 or 427 are electrically connected to external electrodes (or bonding pads) on the bottom of the wafer 30 through via holes. The input terminals of the filter circuit unit 424 or 428 are electrically connected to the balanced terminals of the balun circuit unit 423 or 427 on the wafer.

The manufacturing process of the FBAR filter having an unbalanced-balanced input/output structure, shown in FIG. 3 and implemented on a single chip, can be executed by the following description.

First, the resonators 31a of the filter circuit unit 31 and the first metal layer of the balun circuit unit 32 are simultaneously or sequentially formed on the wafer 30. Next, the sidewalls 31b of the filter circuit unit 31 and the first dielectric layer 33a of the balun circuit unit 32 are formed to be the same thickness using the same material. Further, the second metal layer of the balun circuit unit 32 is formed on the first dielectric layer 33a. Thereafter, the upper cover 31c of the filter circuit unit 31 and the second dielectric layer 33b of the balun circuit unit 32 are formed to be the same thickness using the same material. Finally, the third metal layer of the balun circuit unit 32 is formed on the second dielectric layer 33b. As described above, in the FBAR filter of the present invention, part of the manufacturing processes for forming the filter circuit unit 31 and the balun circuit unit 32, that is, a process of forming the cap structure and a process of forming the dielectric layers, can be implemented as a single manufacturing process, thus simplifying required manufacturing processes. Moreover, the present invention uses an IPD balun proven to be excellent in the implementation of mass production at the time of implementing an FBAR filter having an unbalanced-balanced input/output structure, thus increasing the yield of the FBAR filter itself.

As described above, the present invention provides an FBAR filter having an unbalanced-balanced input/output structure, which have excellent advantages in that a filter circuit and a balun circuit can be implemented on a single wafer, thus enabling the implementation of a single chip, and which implements part of the manufacturing processes for manufacturing the filter circuit and the balun circuit as a single process, thus simplifying the manufacturing processes. Further, the present invention is advantageous in that it uses the structure of an IPD balun at the time of implementing the balun circuit, thus improving the implementation of the mass production of the FBAR filter.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A Film Bulk Acoustic Resonator (FBAR) filter having an unbalanced-balanced input/output structure for receiving an unbalanced input signal, filtering the unbalanced input signal in a predetermined frequency band and outputting a filtered signal as a balanced output signal, the FBAR filter comprising:
    a wafer;
    a filter circuit unit including a plurality of FBAR resonators formed on a predetermined region on a top of the wafer; and
    a balun circuit unit including a plurality of metal layers electrically connected to each other to implement a balun circuit and a plurality of dielectric layers each placed between the plurality of metal layers, the balun circuit unit being electrically connected to the filter circuit unit on a predetermined region of the wafer;
    wherein the filter circuit unit is hermetically sealed by a cap structure including sidewalls with a certain height and an upper cover coupled to top of the sidewalls.

2. The FBAR filter according to claim 1, wherein the filter circuit unit is implemented with a ladder-type filter circuit unit.

3. The FBAR filter according to claim 1, wherein the filter circuit unit is implemented with a lattice-type filter circuit unit.

4. The FBAR filter according to claim 1, wherein the balun circuit unit is a transmission line-type balun circuit including two or more striplines.

5. The FBAR filter according to claim 1, wherein the balun circuit unit is a lumped element-type balun circuit implemented with a combination of passive devices, such as a resistor (R), an inductor (L) and a capacitor (C).

6. The FBAR filter according to claim 1, wherein the sidewalls and the upper cover of the filter circuit unit and the dielectric layers of the balun circuit unit are made of a dry film.

7. The FBAR filter according to claim 6, wherein the balun circuit unit includes a first metal layer formed on the wafer, a first dielectric layer formed on the first metal layer at a height identical to that of the sidewalls of the filter circuit unit, a second metal layer formed on the first dielectric layer, a second dielectric layer formed on the second metal layer at a height identical to that of the upper cover of the filter circuit unit, and a third metal layer formed on the second dielectric layer.

8. The FBAR filter according to claim 1, wherein the sidewalls and the upper cover of the filter circuit unit and the dielectric layers of the balun circuit unit are made of the same material.

9. The FBAR filter according to claim 1, wherein the sidewalls and the upper cover of the filter circuit unit and the dielectric layers of the balun circuit unit are made of a polymer.

* * * * *